United States Patent [19]
Kim et al.

[11] Patent Number: 5,642,038
[45] Date of Patent: Jun. 24, 1997

[54] METHOD OF DETECTING PARTIAL DISCHARGE USING FREQUENCY SPECTRUM ANALYZER

[75] Inventors: Taek-Soo Kim; Myong-Soo Park, both of Daejeon; Yong-Joo Kim, Kyongsangnam-do; Jin-Bong Kim, Kyongsangnam-do; Don-Ha Hwang, Kyongsangnam-do, all of Rep. of Korea

[73] Assignees: Korea Electrotechnology Research Institute; Korea Electric Power Corporation, both of Rep. of Korea

[21] Appl. No.: 573,418

[22] Filed: Dec. 15, 1995

[30] Foreign Application Priority Data

Aug. 28, 1995 [KR] Rep. of Korea ................. 95-26898

[51] Int. Cl.$^6$ ............................ G01R 19/00; G01R 31/12
[52] U.S. Cl. ................................. 324/76.19; 324/76.34; 324/536; 324/551
[58] Field of Search ............................ 324/536, 541, 324/544, 546, 547, 551, 772, 76.19, 76.27, 76.34

[56] References Cited

U.S. PATENT DOCUMENTS

| | | | |
|---|---|---|---|
| 4,646,248 | 2/1987 | Reynolds | 324/542 |
| 5,075,629 | 12/1991 | Umemura et al. | 324/547 |
| 5,475,312 | 12/1995 | Sedding et al. | 324/536 |

OTHER PUBLICATIONS

Article entitled "Novel Partial Discharge Measurement Technique For Generator Stator Windings" by Kim, et al., Apr. 28, 1995.

Primary Examiner—Kenneth A. Wieder
Assistant Examiner—Diep Do
Attorney, Agent, or Firm—Michael D. Bednarek; Kilpatrick Stockton LLP

[57] ABSTRACT

A method of detecting a partial discharge signals occurring at an insulator, using a Frequency Spectrum Analyzer (FSA) with a monitor screen. The method including the steps of setting a horizontal axis of the monitor screen as a time axis and a vertical axis as an axis representing a voltage magnitude; receiving a power frequency signal having phase angle and carrying the partial discharge signals derived from the insulator being tested, to display the magnitudes of the partial discharge signals based on the time axis; detecting each of the maximum value of the partial discharge signals being displayed by the receiving step, to cause them to be evaluated into coordinate values of the horizontal axis and the vertical axis discriminating each of the phase angles of the power frequency signal based on the coordinate value of the horizontal axis detected by the detecting step, and evaluating each of the magnitudes of the partial discharge signals positioned at respective phase angles of the power frequency signal based on the coordinate value of the vertical axis; and overlapping each the phase angle of the partial discharge signals positioned at the respective phase angles evaluated by the discriminating step with each other according to corresponding phase angles, and comparing them relative to each other, such that the magnitude and number of the partial discharge signals appearing at the respective phase angles of the power frequency signal can be evaluated.

5 Claims, 3 Drawing Sheets

5,642,038

METHOD OF DETECTING PARTIAL DISCHARGE USING FREQUENCY SPECTRUM ANALYZER

FIELD OF THE INVENTION

The present invention relates to a method for measuring a partial discharge signal occurring at an insulator, and more particularly, to a method for measuring a partial discharge in a time domain utilizing a commercially available Frequency Spectrum Analyzer (hereinafter, referred to as "FSA"), without the use of a dedicated measuring instrument for a specific purpose only in measuring the partial discharge signal.

BACKGROUND OF THE INVENTION

Recently, with the increase in the amount of power consumption and the accelerated advancement of automated industrial equipments, such as it has been annually brought out in the data communication fields, it is necessary to supply a reliable power source to the equipment. As a result, the stability of the power for the growing high-tech industries is the most imperative factor to operate the power equipments without interruption. Numerous attempts have been made to study an insulation diagnosis for the stator windings of generator in order to avoid impact of unscheduled outages in a high powered system due to insulation failures and to establish a reliable schedule in maintenance and repair thereof. The most frequently used technique in the art is an analysis and diagnosis method for the state of insulation which is performed by measuring and analyzing the partial discharge, which most effectively represents the local degradation state of the insulation concerned. The partial discharge described above is a phenomenon occurring at a portion, to which the high voltage is applied, in high voltage power equipments or many kinds of insulators, and which generally occurs even in a normal state or environment. Especially, when the partial discharge occurs due to the aging of mechanism, the magnitude thereof will be very high, which results in insulation failures of the system. Therefore, since the partial discharge as mentioned above acts as a factor which degrades safe operation and reliability of the system due to abrupt failures of the system, it becomes the most imperative parameter to identify the modulation state thereof, which should be frequently tested in a regular manner. A test for detecting the partial discharge according to the prior art is to use a partial discharge detector or a normally used oscilloscope.

However, according to the partial discharge detector or a normally used oscilloscope as mentioned above, although it has capabilities of magnitude analysis and frequency domain analysis of the partial discharge signal in connection with the time variation, it is impossible to perform a precise measurement of the frequency characteristics and the number of partial discharge pulse signals. In addition, since the frequency bandwidth of the prior art partial discharge detector is within low frequency bandwidth of 20–300 kHz, the partial discharge measurement of the insulation can only be made after the power voltage is applied directly to the insulation, which can not eliminate external noises. Therefore, the prior art method has a drawback of the partial discharge measurement for only off-line insulation diagnosis being possible.

Therefore, in order to overcome the mentioned problem, a digital Partial Discharge Analyzer (hereinafter, referred to as "PDA") as shown in FIG. 1 has been developed. In the digital PDA, the phase angle distribution in a fixed bandwidth of the partial discharge signal is represented by a gradual measurement of the phase angle information and the number of partial discharges magnitude with respect to the normal bandwidth interval of the partial discharge. This analyzer was designed utilizing one channel analysis technique or A/D conversion method. According to the analyzer, the partial discharge measurement can be effectuated not only for a predetermined bandwidth of high frequency of 1–800 Mhz, but also in on-line state of the power equipment. Also, the magnitude, the phase angle and the number of the partial discharge pulse signals can be represented by 2- or 3-dimensional plot, preferably. In addition to the above, the external noises can also be eliminated using the difference in a signal reception time (a signal transmission time) in a differential amplifying circuit.

It is noted that since the digital PDA as shown in FIG. 1 is well known in the art, the detailed description thereof will not be made more in detail for the simplicity of the specification.

However, this technique still has a disadvantage that since the partial discharge measurement is made only to predetermined frequency components which are being preset in every product of commercial analyzers, the bandwidth of frequency being measured is limited. In addition, since the phase angle distribution in the fixed bandwidth (magnitude) of the partial discharge signal is represented by a gradual measurement of the phase angle information by a predetermined amplitude and the number of the partial discharge magnitude with respect to a normal bandwidth interval of the partial discharge, the distribution of the phase angle information and the magnitude of the partial discharge being simultaneously occurred over one period(1 cycle) of the supply voltage of 60 Hz which is applied for the measurement thereof are not represented. Moreover, this technique additionally requires an expensive, dedicated measuring equipment for use with the partial discharge measurement.

Therefore, it is an object of the present invention to overcome the above disadvantages in the prior art and provide a method for measuring a partial discharge of an insulator by measuring partial discharge pulses occurring at the insulator, such as the stator windings of generator using a Frequency Spectrum Analyzer(FSA) for diagnosis of the stator windings of generator, and then analyzing the data measured therefrom.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

A method of detecting a partial discharge signals occurring at an insulator, using a Frequency Spectrum Analyzer (FSA) with a monitor screen according to the present invention is defined by the claims with a specific embodiment shown in the attached drawings. For the purpose of summarizing the invention, a first embodiment of the invention comprises the steps of setting a horizontal axis of the monitor screen of the FSA as a time axis and a vertical axis thereof as an axis representing a voltage magnitude, with the horizontal axis and the vertical axis being constituted with a plurality of pixels; receiving a power frequency signal carrying the partial discharge signals from the insulator being tested, to display the magnitudes of the partial discharge signals based on the time axis, the power frequency signal having phase angles; detecting each of the maximum value of the partial discharge signals being displayed by the receiving step, based on the number of the pixels which constitute the horizontal axis and the vertical axis, to cause them to be evaluated into coordinate values of the horizontal axis and the vertical axis, respectively; discriminating each of the phase angles of the power frequency signal based on the coordinate value of the horizontal axis detected by the detecting step, and evaluating each of the magnitudes of the partial discharge signals positioned at respective phase angles of the power frequency signal based on the coordinate value of the vertical axis; and overlapping each the phase angle of the partial discharge signals positioned at respective phase angles evaluated by the discriminating step with each other according to corresponding phase angles, and comparing them relative to each other, such that the magnitude and number of the partial discharge signal appearing at each of the phase angles of the power frequency signal can be evaluated.

According to the second embodiment of the invention, in addition to the first embodiment of the invention, it further comprises the steps of performing a 3-dimensional plot process of the magnitude and number of the partial discharge signals evaluated by the overlapping step by aligning them into the respective phase angles thereof.

According to the third embodiment of the invention, in addition to the first and second embodiments of the invention, it further comprises the steps of performing a 3-dimensional plot process of the magnitude and number of the partial discharge signals evaluated by the overlapping step by aligning them into the respective phase angle thereof, with the partial discharge signals being treated to eliminate no more than 1 MHz of low frequency noise by measuring only a high frequency thereof. According to the inventive measuring method, no less than 3 MHz of frequency bandwidth can be measured, so that noises are completely eliminated.

According to the fourth embodiment of the invention, in addition to the first and second embodiments of the invention, it further comprises the steps of performing a 2-dimensional plot process of the number of the partial discharge signals according to the voltage magnitude of the partial discharge signals by scanning data processed by the 3-dimensional plot in the performing step.

According to the fifth embodiment of the invention, the setting step defined in the first embodiment of the invention further comprises the steps of displaying the power frequency signal of the FSA in the form of the D.C. frequency by setting a frequency span thereof to zero; and performing a sweep process in a single sweeping mode.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

Figure 1:
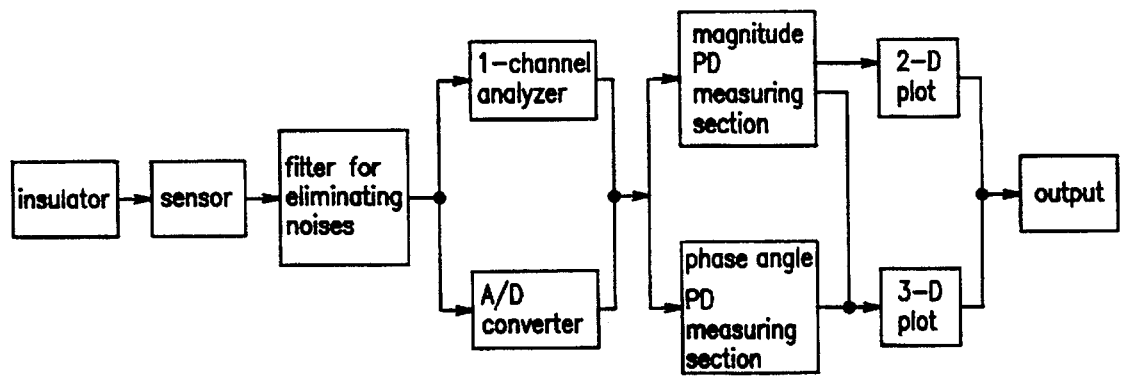
FIG. 1 illustrates a simplified block diagram of a digital partial discharge measuring instrument according to the prior art.
Figure 2:
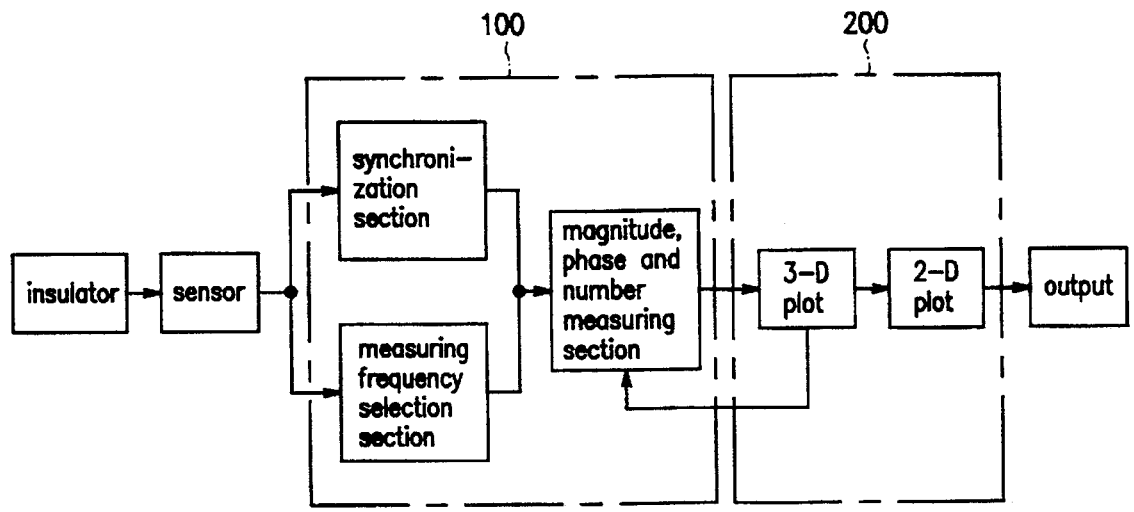
FIGS. 2 illustrates a simplified block diagram of a partial discharge measuring instrument according to the present invention.

Referring now to FIG. 2, it represents a simplified block diagram of a partial discharge measuring instrument according to the present invention.

In the figure, the partial discharge measuring instrument is implemented by a generally used FSA 100 and a computer 200. The operation of the present invention thereof will now be described hereinafter. In the FSA 100, the measurement of the partial discharge at a time domain is performed by setting a frequency span to zero, to thereby transform a horizontal X-axis into the time domain, without the use of the measuring method (horizontal X-axis: frequency) for general purpose.

Figure 3:
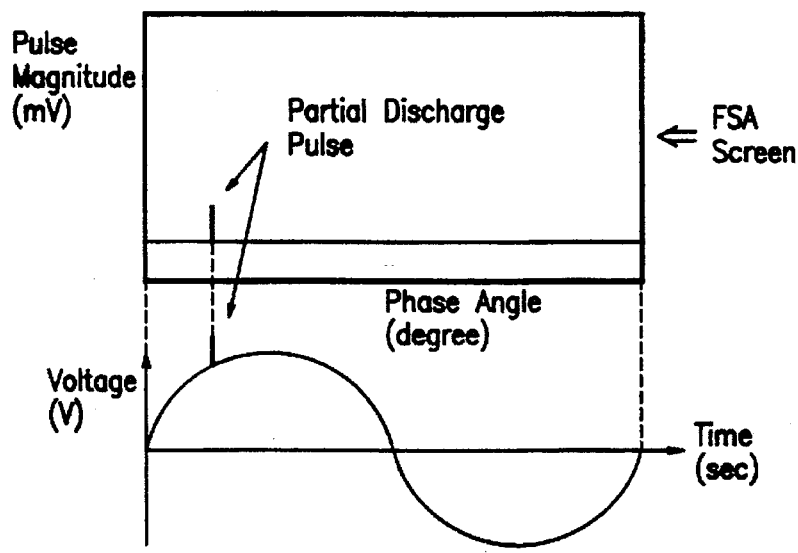
FIG. 3 illustrates a basic principle of measuring the partial discharge according to the present invention.

FIG. 3 illustrates a basic principle of the FSA 100 for measuring the partial discharge according to the present invention. That is, it shows the basic principle of synchronizing technique for the measurement of the phase angle distribution in a fixed bandwidth by triggering sweep signal at zero crossing point of power voltage, and synchronizing sweep time with power frequency. A monitor screen(not shown in the drawing) of the FSA(100) is generally represented by a resolution of 600×600. That is, since the positions of each pixel is represented by column-row coordinates of 600–600, when a sweep period equal to that of the power voltage being 60 Hz is utilized, one period of the power voltage is displayed at the monitor screen of the FSA 100. At the time, if there is no partial discharge, the picture displayed at the monitor screen is represented as linear as the DC voltage has. That is to say, if there is a partial discharge, only the magnitude of the partial discharge sinal carrying on the sine-wave of the power voltage is displayed at the monitor screen in the form of impulse wave. From the above, it will be appreciated that the phase angle of the partial discharge signal displayed at the monitor screen refers to 600 pixel positions corresponding to the horizontal axis, and the magnitude of the partial discharge sinal refers to 600 line positions corresponding to the vertical axis, respectively.

Figure 4:
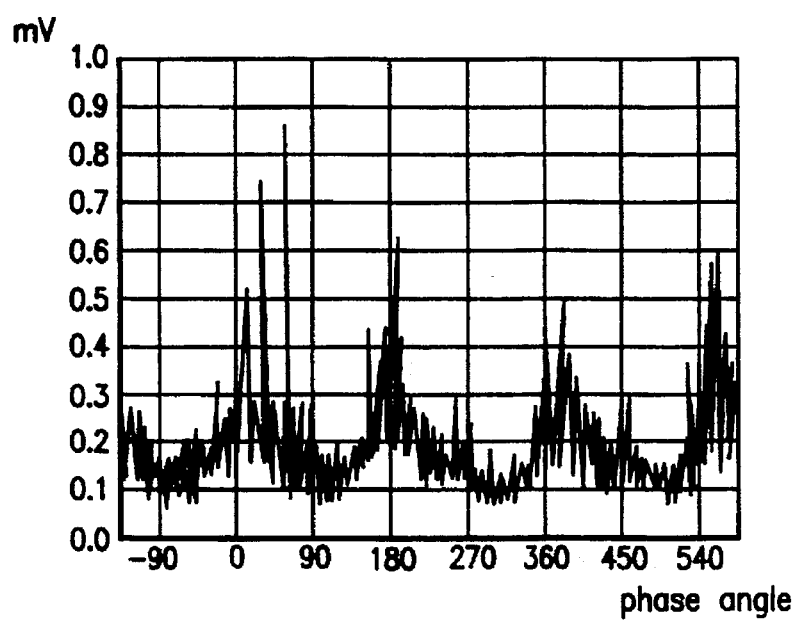
FIG. 4 illustrates a single sweep measurement for phase angle distribution of partial discharge pulse by the FSA of according to the present invention.

FIG. 4 illustrates an example of the practical measurement of the partial discharge displayed at the monitor screen as discussed in connection with FIG. 3, in which a single sweep measurement for a phase angle distribution of partial discharge pulses by the FSA according to the present invention is represented. In the drawing, it shows the single sweep screen of the FSA as a result of the phase angle distribution measurement of the partial discharge pulses with a sweep time of 50 msec. The repetition of single sweep for a pre-determined cycles can build up 3-dimensional plot of the partial discharge signals. Therefore, the partial discharge measuring technique with the FSA can eliminate external noises occurring in a specific frequency bandwidth and identify frequency components of the partial discharge pulses.

Figure 5:
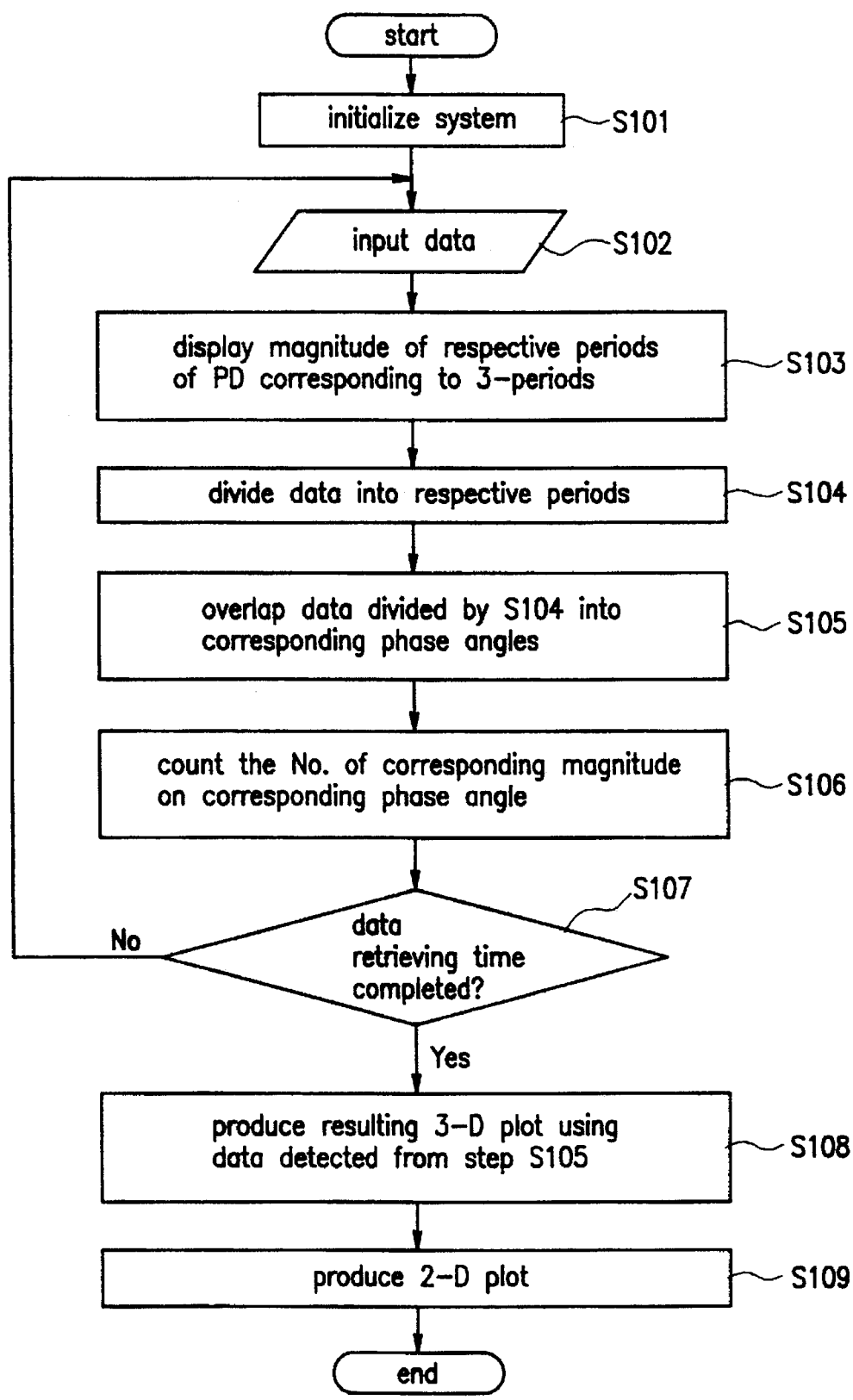
FIG. 5 illustrates a flowchart for explaining an operation of the FSA according to the present invention.

FIG. 5 illustrates a flowchart for explaining an operation of the FSA according to the present invention.

At step S101, it initializes the FSA system. In the step, the frequency span is set to zero, and an external triggered sweep signal is produced at the zero crossing point of the power voltage by synchronizing the sweep time with a power frequency of 60 Hz of the generator. And also, 3 cycles of measured data can measured with single sweep by setting the sweep time to 50 msec. Further, the measurement frequency bandwidth to be tested when measuring the partial discharge signals is set, and sample period, or data detecting time is also inputted. At step S102, it receives data and then proceeds to step S103. At step S103, 3 periods of the measured data of the power frequency is collected at the monitor screen of the FSA 100 by producing a single sweep signal, and is displayed thereon. At step S104, the measured data is divided into respective corresponding periods by dividing the partial discharge data displayed in step S103 by 3 equal parts.

When the data is divided into the 3 equal parts of the respective periods at step S104, the divided data is then compared with each other in line with the respective phase angles by overlapping them with each other at step S105, and then the number of the resulting data which has the same magnitude as that of each phase angle is counted at step S106. For example, since the coordinate values of the pixels constituting the horizontal axis of the entire screen are 600, the density of the partial discharge on the corresponding phase angles is obtained by dividing the data into the respective periods of the pixels, 600/3(=200) and overlapping the data divided into the respective periods with each other. Thereafter, it proceeds to step S107 in which it is determined whether the sampling period, or data retrieving time has been completed. If so, the process returns to step S102 to repeat the above procedure again, and if not, it proceeds to step S108.

At step S108, the resulting 3-dimensional plot of the partial discharge signal(X-axis: phase angle, Y-axis: number, Z-axis: amplitude) can be built up, utilizing the data overlapped with each other into each period at step S105. At the time, the process of producing the 3-dimensional plot of the partial discharge signal at step S105 is actually achieved between step S106 and step S107, the detailed description thereof will be abbreviated, for the simplicity of the specification. Thereafter, at step S109, the 3-dimensional plot of the number of discharge depending on the voltage magnitude of the partial discharge signal(X-axis: amplitude, Y-axis: number) can also be build up by scanning the 3-dimensional plot of the partial discharge signal produced at step S108.

The method of detecting the partial discharge signal using the FSA according to the present invention can provide more superior measuring method of the partial discharge as compared with those of commercially available partial measuring instruments. In addition, The superior effect of the present invention as mentioned above can be verified from the comparison of the PDA for hydroelectric power generator and the Turbine Generator Analyzer (hereinafter, referred to as "TGA") for thermoelectric power generator, as shown in the following Table.

TABLE

Specifications of PDA, PDA-PARTNER, TGA, and FSA

| Spec./instrument | PDA-H | PDA Partner | TGA | FSA |
|---|---|---|---|---|
| Bandwidth [Mhz]: | 1–150 | 10–70 | 20–800 | 50 Hz–2.9 GHz |
| Dynamic Amplitude Range [mV]: | 100–2500 | 20–8000 | 2–4000 | 2.2 µV–7071 mV |
| Amplitude Resolution [mV]: | 5 | 2.25 | 2 | 0.0037 µV |
| Max. Amplitude Window (nominal): | 15 | 64 (32) | 400 (32) | 600 (100) |
| Phase Resolution [deg]: | None | 1.4" | 3.6" | 1.8" |
| Max. Phase Window: | None | 256 | 100 | 200 |

As described above, according to the effect of the present invention, an expensive, dedicated measuring equipment for use with the partial discharge measurement is no more required. In addition, wideband frequency characteristics of the FSA according to the invention allows the versatile application both to the PDA for on-line in low frequency and the PDA for off-line in high frequency. Further, the partial discharge magnitude, the number of the partial discharge pulses, phase angle distribution and frequency characteristics of the partial discharge pulses can be easily analyzed in 2- or 3-dimensional plot.

Although the present invention and its advantages have been described in detail, it should be understood that various changes, substitutions and alterations can be made herein without departing from the spirit and scope of the invention as defined by the appended claims.

What is claimed is:

1. A method for measuring partial discharge signals occurring at an insulator, using a Frequency Spectrum Analyzer(FSA) with a monitor screen, the method comprises the step of:

a) setting a horizontal axis of said monitor screen of said FSA as a time axis and a vertical axis thereof as an axis representing a voltage magnitude, with said horizontal axis and said vertical axis being constituted with a plurality of pixels;

b) receiving a power frequency signal carrying said partial discharge signals derived from said insulator being tested, to display the magnitudes of said partial discharge signals based on said time axis, said power frequency signal having phase angles;

c) detecting each of the maximum value of said partial discharge signals being displayed by the step b), based on the number of said pixels which constitute said horizontal axis and said vertical axis, to cause them to be evaluated into coordinate values of said horizontal axis and said vertical axis, respectively;

d) discriminating each of the phase angles of said power frequency signal based on said coordinate value of said horizontal axis detected by the step c), and evaluating each of the magnitudes of the partial discharge signals positioned at respective phase angles of said power frequency signal based on said coordinate value of said vertical axis; and e) overlapping each said phase angle of the partial discharge signals positioned at the respective phase angles evaluated by the step d) with each other according to corresponding phase angles, and comparing them relative to each other, such that the magnitude and number of the partial discharge signals appearing at the respective phase angles of said power frequency signal can be evaluated.

2. A method for measuring partial discharge signals occurring at an insulator of claim 1 further comprising the step of:

f) performing a 3-dimensional plot process of the magnitude and number of the partial discharge signals evaluated by the step e) by aligning them into the respective phase angles thereof.

3. A method for measuring partial discharge signals occurring at an insulator of claim 1 further comprising the step of:

g) performing a 3-dimensional plot process of the magnitude and number of the partial discharge signals evaluated by the step e) by aligning them into the respective phase angles thereof, with said partial discharge signals being treated to eliminate a low frequency noise by measuring only a high frequency thereof.

4. A method for measuring partial discharge signals occurring at an insulator of claim 1 further comprising the step of:

g) performing a 2-dimensional plot process of the number of the partial discharge signals according to the voltage magnitude of the partial discharge signals by scanning data processed by the 3-dimensional plot in the step g).

5. A method for measuring partial discharge signals occurring at an insulator of claim 1, said step a) further comprises the step of:

a-1) displaying said power frequency signal of the FSA in the form of the D.C. frequency by setting a frequency span thereof to zero;

a-2) performing a sweep process in a single sweeping mode.

* * * * *